United States Patent [19]
DiSanto et al.

[11] Patent Number: 5,177,476
[45] Date of Patent: Jan. 5, 1993

[54] METHODS OF FABRICATING DUAL ANODE, FLAT PANEL ELECTROPHORETIC DISPLAYS

[75] Inventors: Frank J. DiSanto, North Hills; Denis A. Krusos, Lloyd Harbor; Frederic E. Schubert, Shoreham, all of N.Y.

[73] Assignee: Copytele, Inc., Huntington Station, N.Y.

[21] Appl. No.: 746,865

[22] Filed: Aug. 19, 1991

Related U.S. Application Data

[63] Continuation of Ser. No. 440,787, Nov. 24, 1989.

[51] Int. Cl.⁵ .............................................. G09G 3/34
[52] U.S. Cl. .................................... 340/787; 359/296
[58] Field of Search ............... 340/787; 359/296; 204/299 R; 430/20; 428/1

[56] References Cited

U.S. PATENT DOCUMENTS

| | | | |
|---|---|---|---|
| 4,522,472 | 6/1985 | Liebert et al. | 359/296 |
| 4,655,897 | 4/1987 | DiSanto et al. | 359/296 |
| 4,680,103 | 7/1987 | Beilin Solomon I. | 359/296 |
| 4,686,524 | 8/1987 | White | 359/296 |
| 4,742,345 | 5/1988 | DiSanto et al. | 340/752 |
| 5,053,763 | 10/1991 | DiSanto et al. | 359/296 |
| 5,077,157 | 12/1991 | DiSanto et al. | 359/296 |

*Primary Examiner*—Ulysses Weldon
*Assistant Examiner*—Matthew Luu
*Attorney, Agent, or Firm*—Arthur L. Plevy

[57] ABSTRACT

There is disclosed methods for fabricating electrophoretic displays. Essentially the methods employ selective materials such as different metals which are capable of being etched by different etchants. In this manner, a laminate is provided to form a grid matrix which is insulated from a cathode matrix which grid matrix is also insulated from a second anode matrix. The entire display utilizes a local or second anode and a remote anode to further control pigment particle migration. The display is fabricated by two methods both of which employ selective etching of the parallel line type of display electrodes which constitute a cathode, a grid and a local anode.

10 Claims, 2 Drawing Sheets

METHODS OF FABRICATING DUAL ANODE, FLAT PANEL ELECTROPHORETIC DISPLAYS

CROSS-REFERENCE TO RELATED APPLICATIONS

This application is a continuation of U.S. Ser. No. 07/440,787, filed Nov. 24, 1989 for Methods of Fabricating Dual Anode, Flat Panel Electrophoretic Displays, which has been allowed. This application is related to U.S. Ser. No. 07/345,825, filed May 1, 1989 for Dual Anode Flat Panel Electrophoretic Displays, which is also allowed.

BACKGROUND OF THE INVENTION

This invention relates to electrophoretic display apparatus in general and more particularly to methods for fabricating such displays having a dual anode structure.

A dual anode, flat panel, electrophoretic display apparatus has been described in copending application Ser. No. 345,825 filed May 1, 1989 entitled Dual Anode Flat Panel Electrophoretic Display Apparatus for Frank J. DiSanto and Denis A. Krusos the inventors herein and assigned to Copytele Inc. the assignee herein. That application describes an electrophoretic display which has a grid cathode matrix arrangement consisting of a first plurality of parallel conductive lines insulated from a second plurality of parallel conductive lines which are transverse to said first plurality. Located with respect to the grid and cathode are first and second anode structures. The first anode is removed from the second with the second anode overlying the grid lines of the display and insulated therefrom. The second anode is biased to implement typical hold and erase modes independent of the first anode and the display structure as indicated in the application exhibits many advantages when compared with prior art displays.

Essentially the electrophoretic display (EPID) is well known and there exists many patents and articles in the prior art which describe operation and characteristics as well as describing methods of fabricating such displays. The following patents are illustrative of prior art devices and approaches. These patents issued in the name of Frank J. DiSanto and Denis A. Krusos, the inventors herein and are assigned to Copytele, Inc. the assignee herein. Apart from the patents to be described below there are of course many references which were cited in the prosecution of these patents as well as additional references which were cited in the background of these patents. Many of the techniques and methods of fabricating such displays are disclosed in the patents that follow, as well as in the additional references as indicated.

Essentially, one is referred to U.S. Pat. No. 4,655,897 issued on Apr. 7, 1987 entitled ELECTROPHORETIC DISPLAY PANELS AND ASSOCIATED METHODS. This patent describes a typical electrophoretic display apparatus utilizing an X-Y matrix consisting of grid and cathode lines which are insulated one from the other and which are associated with an anode electrode. The space between the grid and cathode lines and the anode electrode is filled with an electrophoretic dispersion. The patent describes techniques for making such displays as well as suitable dispersions and materials for use with such displays.

U.S. Pat. No. 4,732,830 issued on Mar. 22, 1988 entitled ELECTROPHORETIC DISPLAY PANELS AND ASSOCIATED METHODS. This patent describes methods for making electrophoretic displays as well as describing display construction and operation.

U.S. Pat. No. 4,742,345 entitled ELECTROPHORETIC DISPLAY PANEL APPARATUS AND METHODS THEREFORE issued on May 3, 1988. This patent describes improved electrophoretic display panels exhibiting improved alignment and contrast as well as describing circuitry for use with such a display and methods for fabricating such a display.

U.S. Pat. No. 4,746,917 issued on May 24, 1988 entitled METHOD AND APPARATUS FOR OPERATING ELECTROPHORETIC DISPLAYS BETWEEN A DISPLAY AND A NON-DISPLAY MODE. This patent describes various biasing techniques for operating electrophoretic displays to provide writing, erasing as well as operating the display during a display and non-display mode.

U.S. Pat. No. 4,772,820 issued on Sep. 20, 1988 entitled MONOLITHIC FLAT PANEL DISPLAY APPARATUS. This patent describes methods and apparatus for fabricating flat panel displays employing electrophoretic principles as well as structures to enable such displays to be biased and driven by additional circuitry.

Thus as one can see an important consideration of the prior art is to provide an improved display with increased contrast, faster operating time, and more reliable performance. As indicated in the above noted copending application, a particularly disturbing problem which occurs in electrophoretic displays results in the appearance of a bright "flash" emanating from the display during the ERASE mode. This "flash" while occurring over a relatively short period is perfectly visible. The "flash" appears disturbing to many individuals who view the display and is caused by the following phenomenon. For proper operation of the electrophoretic display, the amount of pigment in the suspension is considerably greater than the pigment required to give a suitable background when the panel is in a HOLD condition. The term HOLD is well known in the art, and essentially the electrophoretic panel is placed in a HOLD condition prior to writing the display. In this manner the HOLD condition is achieved when the anode is at a high positive voltage, the grid is at a low voltage, and the cathode is at a high voltage.

Typically the anode would be at a voltage for example of 200 volts with the grid at a lower voltage as for example −12 volts with the cathode at a high voltage which would be +15 volts. With these voltages on the typical prior art electrophoretic display, the display is in the so-called HOLD condition. This HOLD condition is implemented prior to the WRITE mode during which mode new information is written into the display. The excess pigment during the HOLD condition is at the surface of the anode which is at the highest potential with respect to any other of the electrodes. To ERASE the display, the anode is made negative and all the pigment leaves the anode and is at the surface of the grid and cathode. During ERASE, the anode, for example, would be placed at −200 volts. Hence during the ERASE mode, all the pigment leaves the anode and is now at the surface of the grid and cathode accordingly. The cathode side of the flat display during the ERASE mode is considerably brighter than it is during the HOLD causing a bright "flash" to appear on the display even when the ERASE time is extremely short.

The "flash" occurs between frames and may exist every 20 to 30 milliseconds caused by the change in brightness between the HOLD and the ERASE mode. It is, of course, desirable to eliminate this bright "flash" so that the display appears more uniform and stable.

Hence the above noted copending application describes the addition of a second anode which is interposed between the original anode of the electrophoretic display and the cathode to grid matrix. The second anode aides in preventing this flash by allowing the pigment to be selectively controlled.

This present application describes methods for fabricating a dual anode display. The methods to be described shows a second anode or a additional anode which in one embodiment is designed to be parallel with the grid structure and in another embodiment is transverse or perpendicular to the grid structure. These methods include the selective deposition of different materials such as metals and insulators together with the use of selective etches in order to achieve the desired results.

SUMMARY OF THE INVENTION

A method of completing fabrication of an electrophoretic display after a plurality of cathode conductor lines indicative of an X matrix have been formed on a planar glass sheet, comprising the steps of coating the cathode conductor lines with a first insulating layer of photoresist, coating the first insulating layer with a first layer of silicon dioxide, coating a first layer of metal on said layer of silicon dioxide, coating said first layer of metal with a second layer of photoresist, coating said second layer of photoresist with a second layer of silicon dioxide, coating said second layer of silicon dioxide with a second layer of metal capable of being etched by a different etchant than said first, coating said second layer of metal with a third layer of metal capable of being etched by a different etchant from said first and second layer of metal, coating said third layer of metal with a fourth layer of metal capable of being etched by a different etchant than said first, second and third layers of metal, coating said fourth layer of metal with a third layer of photoresist, treating said fourth layer of photoresist to photolithographically form a matrix of lines transverse to said cathode conductor lines and thereafter selectively etching each layer of material until channels separate each of the lines of said matrix wherein there are first and second metal structures insulated from each other and from the cathode structure, coating the treated structure with a layer of silicon dioxide, removing said layer of silicon dioxide as coating said fourth metal layer with said fourth metal layer.

DETAILED DESCRIPTION OF THE FIGURES

Figure 1:
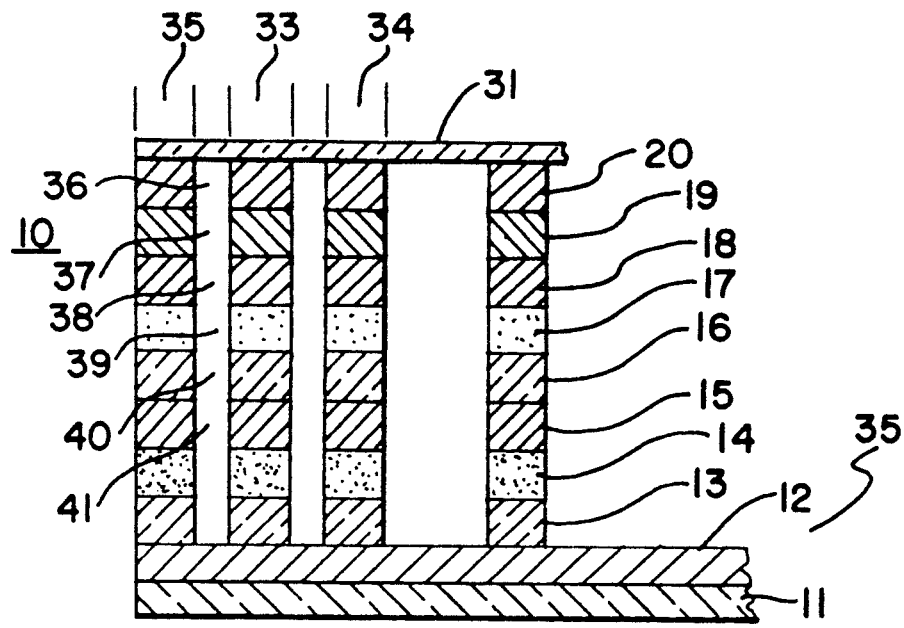
FIG. 1 is a partial cross sectional view showing an electrophoretic display useful in describing certain steps in the fabrication of such a display.

Referring to FIG. 1 there is shown a cross sectional view of an electrophoretic display 10 constructed according to the teachings of this invention. It is immediately noted that the cross sectional view of the display of FIG. 1 includes structure resulting from certain of the processing steps which are not essentially complete.

It is believed that the configuration shown in FIG. 1 is necessary in order to fully understand the invention. The unique part of this particular display is the configuration as well as the method of producing the second or additional anode. The additional anode appears between the cathode 12 and the remote anode which is a conventional anode designated by reference numeral 28 in FIG. 2. As seen from FIG. 2, the remote anode 28 is deposited upon a layer of glass 29. The remote anode 28 for example, may be an extremely thin layer of indium-tin-oxide (ITO) which is deposited upon the layer of glass 29.

As one will further understand, the electrophoretic display is described in many of the prior patents as indicated above, and has a viewing area which includes a bottom glass sheet 11. Disposed upon sheet 11 are a plurality of cathode lines 12. These cathode lines are directed in a horizontal or vertical direction and are essentially parallel to one another to form a matrix or grid of lines. A cross matrix, which is perpendicular to the cathode lines, consists of a series of parallel metal grid lines 15. These metal grid lines exist in prior art electrophoretic displays. The grid lines are separated from the cathode by means of a insulator material. This may be a dual layer of insulator material. A first layer consists of an insulator 13 which for example, is a photoresist material such as FSC-L or FSC-M which essentially are novalac resins or phenolic resins. These resins are available as photoresist materials from a company called Shipley Products.

As seen in FIG. 1 and as will be further explained, the layer of photoresist or insulator 13 has deposited on the surface thereof, a layer of silicon dioxide ($SiO_2$) 14. The layer of silicon dioxide is deposited on the layer of photoresist and thereafter a layer of metal 15 which constitutes the grid electrode is deposited upon the layer of silicon dioxide. In the construction shown in FIG. 1 and as will be further explained, deposited on top of the grid layer 15 is an additional layer 16 of photoresist which has deposited thereon an additional layer 17 of silicon dioxide. On top of the layer of silicon dioxide is a first layer of metal 18, a second layer of metal 19 and a third layer of metal 20. It is important that metal layers 15, 18, 19 and 20 be fabricated from metal materials which are capable of being etched by different selective etchants.

For example, such metal materials may comprise gold, aluminum, titanium-tungsten alloy, zirconium as well as chrome. In this particular instance, the grid electrode layer 15 may be fabricated from chrome while the metal layers 18 and 19 may be an alloy of chrome and aluminum which will etch for example, by means of a different etchant other than the chrome grid layer. The above description indicates the deposition of separate layers which is in fact the case. The structure shown in FIG. 1 results after the steps of selective etching have been implemented as will be explained.

Figure 2:
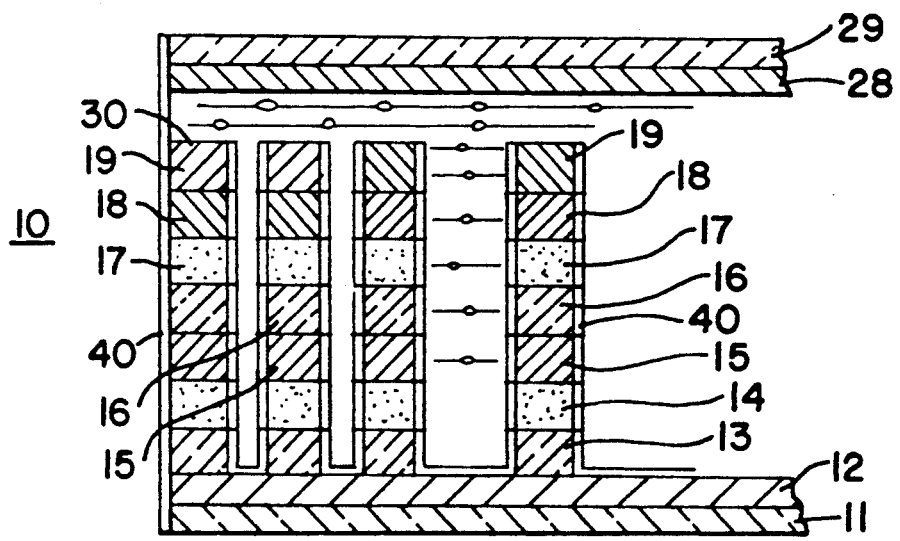
FIG. 2 is a cross sectional view depicting an additional step in the fabrication of such a display.

As one will see, the second anode which will include metal layers 18 and 19, and the grid structure as 15 are perpendicular to the cathode lines 12 and essentially the grid electrode 15 is parallel to and in line with the second anode conductor lines. Before describing the exact process by which the structure of FIG. 1 is fabricated a few comments will be made concerning the operation of the same. As one can understand, the grid lines 15 which are separated from the cathode lines by means of the photoresist layer 13, and the layer of silicon dioxide 14 are disposed transverse to the cathode lines 12 and spatially intersect each cathode line to provide an X-Y matrix arrangement whereby a typical pixel area is accessed by addressing a grid and cathode line thereby providing a desired potential at the intersection between the two lines. This potential causes the migration of electrophoretic particles which are suspended in the electrophoretic suspension 30 and which particles migrate from the grid and cathode structure to the anode 28 (FIG. 2). The anode 28 is a very thin layer of metal as ITO deposited on a planar glass member 29 according to prior art teachings.

Typically the thickness of the insulated areas as 13 and 16 are approximately 3 microns with the layers of silicon dioxide as for example, layers 14 and 17 being about 2000 Angstroms. In the structure shown in FIG. 1 the local anode which will be further described, is of the same configuration as the grid structure. A local anode metal conductor line which eventually comprise metals 18 and 19 for example, is separated from the grid line 15 by the insulating layer 16 and the layer of silicon dioxide 17. Thus there are as many anode lines as there are grid lines. Each segment of the anode can have the same exact configuration as the associated grid segment. It is understood that the grid line can comprise a tine configuration as known in the prior art and such a configuration may or may not be used for the local anode lines. Hence the grid format may be two or more tines with the anode line being a single line or a duplicate tine configuration.

For example, U.S. Pat. No. 4,742,345 describes a grid structure fabricated with respect to the cathode structure in a tine configuration. Thus, one can utilize such a configuration to form the grid structure and therefore the anode structure. The advantages of such arrangements have been fully described in U.S. Pat. No. 4,742,345. In this manner, and as explained in the above-noted copending application Ser. No. 345,825, which is incorporated herein by reference, it is further seen that the local anode structure may consist of a plurality of parallel lines each of which is associated with a grid line, and with each of the parallel lines being dimensioned and congruent with each of the associated grid lines as 15. The biasing of the various electrodes as shown in FIG. 1, has also been explained in detail in the above noted copending application. Thus, the biasing of each electrode in HOLD, ERASE and WRITE modes has been explained as well as the movement of the pigment and the advantages of the display.

The methods of fabricating a dual anode display to be described herein employ alternate approaches. The cross sectional view depicted in FIG. 1 shows certain steps in the fabrication of the display. As indicated, numeral 11 references a planar glass sheet. The glass sheet or plate 11 acts to provide a port through which a viewer of the display may discern image information set forth therein. The glass plate 11 is preferably coated with an extremely thin layer of indium-tin-oxide (ITO) as available as described in many of the above noted patents. The layer of ITO 12 is relatively thin approximately in the range of 300 Angstroms in thickness so that the glass plate 11 retains its relative transparent characteristics. The cathode lines 12 are etched from the ITO layer which is overcoated on the glass plate 11. This may be achieved as will be readily appreciated by those of ordinary skill in the art through conventional photo-etching or engraving techniques. Hence a physical mask bearing representations of the cathode conductors as well as associated contact pads is employed to form an image of the plurality of cathode conductors 12 on the glass plate 11 and thereafter portions of the ITO coating not corresponding to the image are removed. More particularly the glass plate 11 bearing the ITO layer may be initially overcoated with a photoresistive layer of any conventional form and thereafter masked having a conductive pattern associated with the plurality of cathode lines 12 displaced on the photoresistive layer. The glass plate is then exposed to ultraviolet light through the mask and developed.

The pattern remains and eventually is transformed into a plurality of cathode lines. Hence the cathode is conventionally fabricated by means of prior art techniques leaving the glass layer 11 having on the surface thereof a plurality of cathode lines or column lines 12. One can gain further information regarding the construction utilizing the mask and related procedures by reference to U.S. Pat. No. 4,742,345.

After this step the entire structure is coated with an insulating layer of FSC-L or FSC-M. These are photoresist materials as above indicated and are novalac or phenolic resins. The insulating layers 13 are spun onto the surface of the glass plate having the cathode structure 12. Contrary to FIG. 1 an entire layer or coating 13 as shown by the line 31 is deposited upon the surface of the glass plate 11 having the cathode pattern 12 impressed thereon. The entire surface is thus covered. Next a thin layer of silicon dioxide 14 is placed on the entire surface of the insulative layer 13. Again, this is done as a single coat. The layer of silicon dioxide is extremely thin and may be, for example, of a magnitude of 2000 Angstroms with the layer of photoresist being about 3 to 5 microns. After depositing the layer of silicon dioxide 14 a first layer of metal 15 such as aluminum is then deposited upon the silicon dioxide layer. The aluminum can be deposited by many well known techniques such as vapor deposition and so on. After depositing the layer of aluminum, another layer 16 of FSC-L or FSC-M is deposited on the aluminum layer. This layer 16 then has deposited on the surface another layer of silicon dioxide. Then three different metals are deposited on the layer of silicon dioxide. There is first deposited a layer of metal 18 followed by a layer of metal 19, followed by a layer of metal 20. Each of these metals must not be capable of being etched using the same etchant, or capable of being etched by the same etchant as used for the metal deposited on the first layer of FSC-L or FSC-M as layer 15 which is the grid layer. In any event, selective etchants employed for different metals are well known in the art as well as the different metals which are capable of being etched by using different etches. After the last layer of metal 20 is deposited, a coating of photoresist 31 is then spun onto the uppermost metal layer 20. The photoresist layer 31 is shown as a full layer as compared to the column structures depicted for the remaining portions of the grid. It is understood that the lines which are directed through each of the aluminum layers indicate that total laminate is formed prior to the etchant steps.

The photoresist layer 31 is then exposed to a mask which is essentially similar in design to the grid mask and consists of a plurality of parallel lines and is placed transverse to the cathode structures. Thus the mask is used to expose the top photoresist layer 31 in order to eventually provide the column areas as indicated by reference numerals 33, 34 and 35. The photoresist layer 31 is then developed whereby the uppermost layer of the metal 20 is etched using an appropriate etchant for that layer and thus forming a first portion of the channel 36. The next two layers of metal 18 and 19 are etched using appropriate etchants which selectively attack that layer thus forming the further channels 37 and 38. The layer of silicon dioxide 17 is plasma etched using the metal layers as 18, 19 and 20 as a mask, thus forming the next portion of the channel or depression 39. The insulating layer 16 is then plasma etched completely down to the first layer of metal 15 thus forming the next portion of the channel 40. Then the first layer of metal 15 is then etched using an appropriate etchant for that layer forming the next portion of the channel 41. The layer of silicon dioxide between the layer 15 and the insulating layer 13 is then plasma etched. Finally the insulating layer 13 between the first layer of metal 15 and the cathode 12 is plasma etched.

Referring to FIG. 2, after the above noted procedure, one now has the upstanding vertical columns as shown separated by channels. Next the entire structure in FIG. 1 is coated with a layer of silicon dioxide which layer is applied to the entire structure. Then using an appropriate etchant the upper most layer of metal is removed thereby removing the silicon dioxide covering the metal layer 20 as well the metal layer while leaving the metal layer 19 exposed. The side surfaces as well as the spacing between the side surfaces are all covered with an extremely thin layer of silicon dioxide 40. Then utilizing appropriate insulating spacers the anode which includes glass plate 29 and the remote anode structure 28 is attached to the treated structure. At the same time leads are made available not only for the second anode which consists now of metal layers 18 and 19 but also for the original anode as ITO layer 28. Thus as one can understand, the cell is now ready for accepting driver chips which are cemented and bonded to the glass plate in the usual manner and as for example described in U.S. Pat. No. 4,772,820 as indicated above.

It has been determined that by providing a layer of silicon dioxide on the peripheral walls of each of the additional grid and second anode structure, one achieves extreme reliable performance in regard to the device.

Figure 3:
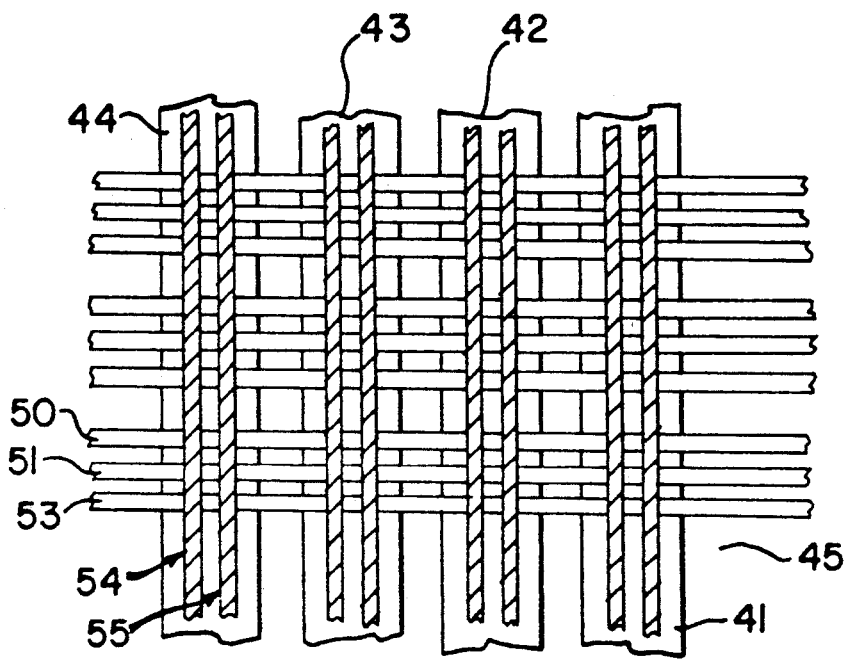
FIG. 3 is a top plan view of an electrophoretic display fabricated according to a different method according to this invention.
Figure 4:
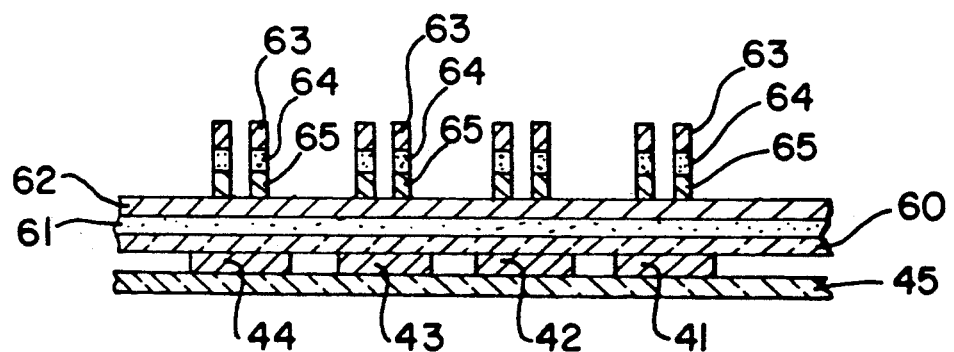
FIG. 4 is a cross sectional view of the display of FIG. 3.

Referring to FIG. 3 there is shown a top plan view of a partial section of an electrophoretic display made according to a second implementation. The top plan view of FIG. 3 shows the structure prior to a final coating of silicon dioxide. Essentially, as seen from FIG. 3, the cathode lines which are deposited as described above, are designated by references numerals 41, 42 and 43. Disposed on top of the cathode lines and insulated therefrom are separate grid tine structures as 50, 51 and 53. The three tine structures 50, 51 and 53 represent for example, a single grid line. Aligned parallel with the cathodes are the second anode lines designated by reference numerals 54 and 55 as associated with the cathode line 44. As will be explained the grid lines as 50, 51 and 53 are fabricated from a different metal than the second anode lines 54 and 55. As one can further see the second anode lines 54 and 55 constitute two lines for each cathode but may be more than two. The grid lines constitute three lines as 50, 51 and 53. The implementation of the display as well as the fabrication of the display can be best described by referring both to FIG. 3 and FIG. 4. .As seen in FIG. 4, the bottom layer 45 which consists of glass has deposited thereon the ITO cathode layers as 41, 42, 43 and 44. The cathode matrix is fabricated as described above and is formed from a single layer of ITO which covers the entire glass sheet which ITO is then suitably etched or engraved to produce individual parallel cathode lines as 41, 42, 43 and 44. Thus the construction of the cathode is implemented utilizing the usual mask and procedures as described above. The next thing that occurs is that a complete layer 60 of FSC-L or FSC-M is deposited on and coats the entire cathode structure. Then a layer of silicon dioxide 61 is vapor deposited or oxidized on the insulating layer 60. The next step in the procedure is to then deposit a layer of metal such as chrome which is layer 62 and deposited on the silicon dioxide layer 61. This layer of metal 62 constitutes the grid structure. A layer of photoresist is then spun on the metal layer 62. This layer is not shown. In any event, the layer of photoresist is then exposed by the grid mask in the usual manner and hence, one produces the grid line pattern as for example, 50, 51 and 53 on the photoresist layer which is spun on the metal layer 62. The grid mask is used to expose the photoresist in the usual manner. After developing the photoresist the metal is etched using a suitable etchant. As indicated, the metal layer 62 is chrome and one would then employ a chrome etchant. The photoresist layer is now stripped off in an appropriate solvent. The layer of silicon dioxide 61 is now plasma etched with the etched metal 62 serving as a mask. This therefore develops the appropriate grid structure. Next an insulating layer of FSC-L or FSC-M is deposited on the patterned metal layer and designated by reference numeral 65. The insulative layer 65 is now coated with a thin layer of silicon dioxide 64. Deposited on top of the layer of silicon dioxide 64 is a second metal layer 63 which may be of a different material than the first layer. This layer 63 consists of two metal layers with a first layer of metal closest to the silicon dioxide layer 64 being the same as the first layer of metal 62. Each layer is capable of being etched by a different etchant. A layer of photoresist is now spun on the uppermost metal layer and completely covers the same.

It is understood that while the layers 63, 64 and 65 are shown as upstanding columns, it is expressly understood that these are distinct layers. After a top layer of photoresist is spun on the uppermost metal layer, a mask including tines similar to but not necessarily the same as the grid is placed on a photoresist such that the pattern is parallel to the cathode as 41 and 42 and perpendicular to the grid as grid line 62. After developing the photoresist, both metal layers are etched using appropriate etchants. The silicon dioxide layer 64 is plasma etched using the metal layers as composite layer 63 as a mask. Both the first and second layers of FSC-L or FSC-M are plasma etched down to the cathode as seen in the top view. Using an appropriate solvent, any residue from the plasma etching is removed. Then a coating of silicon dioxide is applied to the entire structure. Again, using an appropriate etchant, the uppermost layer of metal is removed thereby removing the silicon dioxide covering the metal and leaving the second layer of metal exposed. Using appropriate insulator spacers the remote anode is attached to the structure making sure that a lead is made available for connecting to the anode. The second layer may be connected with all leads in parallel, with each lead individually driven, or with leads being driven in groups. The cell is now ready for accepting driver chips cemented and bonded in the usual manner.

We claim:

1. In an electrophoretic display of the type having a cathode matrix comprising a plurality of parallel lines arranged in a given direction, with a grid matrix insulated from said cathode matrix and comprising a plurality of parallel lines each perpendicular to said cathode lines to form an X-Y addressing matrix with a conventional anode electrode separated from said X-Y matrix with the space between said anode electrode and said X-Y matrix accommodating an electrophoretic dispersion including pigment particles suspended in a fluid, the improvement therewith of:

an additional anode electrode comprising a plurality of parallel lines each associated with and insulated from a respective grid line and each being transverse to said grid line, said additional anode operative when biased to control the path of said pigment particles to and from sad grid and cathode matrix and to allow excess pigment to remain at said conventional anode electrode.

2. The electrophoretic display according to claim 1, wherein sad additional anode lines are of the same configuration as said grid lines.

3. The electrophoretic display according to claim 2, wherein said grid lines are fabricated from chrome with said additional anode lines fabricated from aluminum.

4. The electrophoretic display according to claim 1, wherein said additional anode lines are connected together.

5. The electrophoretic display according to claim 1, wherein groups of said anode lines are connected together to enable selective ERASING of said display.

6. The electrophoretic display according to claim 1, wherein said additional anode lines as insulated from said grid lines are separated therefrom by between 2-5 microns.

7. The electrophoretic display according to claim 6, wherein each one of said grid lines is of a time-like configuration comprising a plurality of parallel lines coupled together at a top contact and a bottom contact.

8. An electrophoretic display panel apparatus, comprising:

a planar member, a first plurality of conductive lines deposited in a first direction of said planar member, each of said first plurality of conductive lines being disposed in a parallel on sad planar member, a second plurality of conductive lines disposed in a second direction on said planar member with said second direction being transverse to said first direction, each of said second plurality of conductive lines spatially crossing each of said first plurality of conductive lines to form a plurality of intersections therebetween, a third plurality of conductive lines disposed in said first direction of said planar member with each of said third plurality of lines transverse to each of said second plurality of lines and means for insulating said first plurality of conductive lines from said second plurality of conductive lines and from said third plurality of conductive lines and, means overlying said planar member and said first, second and third plurality of conductive lines for establishing a fluid-tight panel, with said means overlying creating a space above said planar member for maintaining an electrophoretic dispersion with said means including a thin conductive film located thereon for receiving electrophoretic particles and, means for biasing said first, second and third plurality of conductive lines with respect to said conductive film to control the transportation of said particles within said display.

9. The electrophoretic display according to claim 8, wherein said second plurality of lines are fabricated from chrome with said third plurality of lines fabricated from aluminum.

10. The electrophoretic display according to claim 9, wherein said planar member is glass with said first plurality of lines being fabricated from ITO.

* * * * *